(12) United States Patent
Min et al.

(10) Patent No.: US 8,018,690 B2
(45) Date of Patent: Sep. 13, 2011

(54) CPP MAGNETIC RECORDING HEAD WITH SELF-STABILIZING VORTEX CONFIGURATION

(75) Inventors: Tai Min, San Jose, CA (US); Pokang Wang, San Jose, CA (US); Min Li, Dublin, CA (US); Otto Vogeli, Morgan Hill, CA (US)

(73) Assignee: Headway Technologies, Inc., Milpitas, CA (US)

( * ) Notice: Subject to any disclaimer, the term of this patent is extended or adjusted under 35 U.S.C. 154(b) by 740 days.

(21) Appl. No.: 12/079,470

(22) Filed: Mar. 27, 2008

(65) Prior Publication Data
US 2008/0180865 A1 Jul. 31, 2008

Related U.S. Application Data

(62) Division of application No. 10/953,085, filed on Sep. 29, 2004, now Pat. No. 7,356,909.

(51) Int. Cl.
*G11B 5/39* (2006.01)
(52) U.S. Cl. .................. 360/324.12; 360/324.2
(58) Field of Classification Search .......... 360/319, 360/324.1, 324.11, 324.12, 324.2
See application file for complete search history.

(56) References Cited

U.S. PATENT DOCUMENTS

| | | | |
|---|---|---|---|
| 5,883,763 A | 3/1999 | Yuan et al. | |
| 5,898,548 A | 4/1999 | Dill et al. | |
| 6,023,395 A | 2/2000 | Dill et al. | |
| 6,269,018 B1 | 7/2001 | Monsma et al. | |
| 6,466,419 B1 | 10/2002 | Mao | |
| 6,590,750 B2 | 7/2003 | Abraham et al. | |
| 6,654,278 B1 | 11/2003 | Engel et al. | |
| 6,680,832 B2 | 1/2004 | Fontana, Jr. et al. | |
| 6,735,062 B1 * | 5/2004 | Pokhil et al. | 360/324.12 |
| 7,436,638 B1 * | 10/2008 | Pan | 360/324.11 |
| 7,697,243 B1 * | 4/2010 | Novosad et al. | 360/324 |
| 2003/0107849 A1 * | 6/2003 | Ikarashi | 360/324.1 |
| 2003/0133234 A1 * | 7/2003 | Furukawa et al. | 360/324.12 |
| 2005/0068689 A1 * | 3/2005 | Sato et al. | 360/324.1 |
| 2005/0174701 A1 * | 8/2005 | Kasiraj et al. | 360/324.2 |
| 2006/0092580 A1 * | 5/2006 | Carey et al. | 360/324.11 |
| 2006/0291108 A1 * | 12/2006 | Sbiaa et al. | 360/324.12 |
| 2009/0180218 A1 * | 7/2009 | Bae et al. | 360/324.1 |
| 2010/0053822 A1 * | 3/2010 | Xi et al. | 360/324.2 |
| 2011/0085258 A1 * | 4/2011 | Bae et al. | 360/31 |

* cited by examiner

*Primary Examiner* — Jefferson Evans

(74) *Attorney, Agent, or Firm* — Saile Ackerman LLC; Stephen B. Ackerman

(57) ABSTRACT

A CPP MTJ or GMR read sensor is provided in which the free layer is self-stabilized by a magnetization in a circumferential vortex configuration. This magnetization permits the pinned layer to be magnetized in a direction parallel to the ABS plane, which thereby makes the pinned layer directionally more stable as well. The lack of lateral horizontal bias layers or in-stack biasing allows the formation of closely configured shields, thereby providing protection against side-reading. The vortex magnetization is accomplished by first magnetizing the free layer in a uniform vertical field, then applying a vertical current while the field is still present.

10 Claims, 3 Drawing Sheets

CPP MAGNETIC RECORDING HEAD WITH SELF-STABILIZING VORTEX CONFIGURATION

This is a Divisional Application of U.S. patent application Ser. No. 10/953,085, filed on Sep. 29, 2004 now U.S. Pat. No. 7,356,909, which is herein incorporated by reference in its entirety and assigned to a common assignee.

BACKGROUND OF THE INVENTION

1. Field of the Invention

This invention relates generally to the fabrication of a giant magnetoresistive (GMR) or a tunneling magnetic junction (TMJ) magnetic field sensor in the current-perpendicular-to-plane (CPP) configuration, more specifically to self-stabilization provided by a vortex configuration of the magnetization of the free layer of such a sensor.

2. Description of the Related Art

The CPP (current perpendicular to plane) configuration of a giant magnetoresistive (GMR) sensor or tunneling magnetic junction (TMJ) sensor is a multi-layered configuration of magnetic and non-magnetic layers which includes a magnetically free layer, whose magnetic moment is free to respond to outside magnetic stimuli, separated by a non-magnetic layer from a magnetically "pinned" layer, whose magnetic moment is fixed in direction. In the GMR sensor the non-magnetic layer is an electrically conducting, non-magnetic layer. In the TMJ sensor the non-magnetic layer is a tunnel barrier layer formed of insulating material. In the GMR sensor, the motion of the free layer magnetic moment relative to the pinned layer magnetic moment changes the resistance of the sensor so that a "sense" current passing perpendicularly through the layers produces measurable voltage variations across the sensor. In the TMJ sensor, the motion of the free layer magnetic moment relative to the pinned layer magnetic moment affects the availability of tunneling states across the tunnel barrier layer and thereby changes the amount of perpendicular current that passes through the layer.

One of the problems associated with the design of a CPP sensor in either the GMR or MTJ configuration is the stabilization of its magnetically free layer. In general, the magnetization of the free layer would be fragmented into a multiplicity of domains. Small domains at the lateral edges of the free layer have magnetization directions that are relatively easy to move. If no edge domains are formed, the magnetization at the free layer edges are referred to as "uncompensated poles," because there are no adjacent magnetization vectors to hold them in a fixed position. Because of these uncompensated poles or edge domains, the general magnetization of the free layer is not fixed in time, but changes easily as a result of thermal agitation and/or external fields, leading to a form of noise in the sensor signal called Barkhausen noise. It is, therefore, desirable to maintain the free layer in a single domain state, which would be much less subject to agitation. This process is called stabilization. Since the magnetization of the free layer is typically directed "longitudinally" (within the plane of the layer and within the plane of the air-bearing-surface (ABS) of the sensor), whereas the magnetization of the pinned layer is typically directed transversely to the ABS plane, the stabilization of the free layer is accomplished by what is called a "longitudinal bias layer (LBL) (or biasing layer).". These layers are generally permanent magnets (called "hard bias"), which couple magneto-statically to uncompensated magnetization vectors at the lateral edges of the free layer and, in effect, hold them in position and produce the single domain. These biasing layers may be placed at the stack edges and insulated from them, or placed "in-stack."

In the CPP configuration, placing conducting permanent magnets on each side of the layer configuration produces an even more severe and immediate problem, since the magnets would give the sense current a pathway that bypasses the sensor configuration. Although this problem can be ameliorated by placing insulating layers between the biasing layers and the sensor, this solution increases the difficulties of fabricating the sensor.

It is seen from the above brief discussion, that maintaining the domain stabilization of the free layer is a problem of concern and methods adopted to provide such stabilization are not completely satisfactory. A completely different approach to stabilizing the magnetization of a free layer is to magnetize it in such a way that uncompensated edge magnetization does not exist, so that biasing at the edges is no longer required. The approach of the present invention is to magnetize the free layer in a vortex configuration, so that its magnetization vectors are directed circumferentially about an axis passing vertically through the layer planes of the GMR device. As is well known, such a magnetization direction occurs about a long current carrying wire, so it is to be expected that the use of a unidirectional current will be important in establishing such a vortex configuration within the free layer plane. The vortex configuration is not unknown in the prior art and it has been discussed in relationship to several inventions relating to MRAM configurations rather than sensor configurations.

Monsma et al. (U.S. Pat. No. 6,269,018) teaches a magnetic tunneling junction MRAM element in which the cell is formed in the shape of a disk and the magnetic fields in the ferromagnetic layers are vortex-shaped. The state of the device is written by changing the handedness of the vortex. It is also noted that the vortex shaped field reduces unwanted interactions between neighboring cells.

Engel et al. (U.S. Pat. No. 6,654,278) teaches the formation of an MRAM device in which a reference layer has a vortex-shaped magnetic field with a zero net magnetic moment. During read operations, a magnetic field shifts the center of the vortex, causing a net magnetic moment to be acquired by the reference layer and, thereby, enabling the magnetic moment of the free layer to be determined. Thus the reference layer plays an active role in the read operation of the cell.

Abraham et al. (U.S. Pat. No. 6,590,750) teaches the formation of a magnetic tunneling junction in which tunneling is restricted to specific areas between the ferromagnetic layers in which the magnetic moments can be reliably switched. It is noted that the curling of the magnetic field lines is a cause of the unreliability in the conventional tunneling junction cell.

The present invention provides a vortex shaped magnetic field in the free layer of a magnetic tunneling junction read head sensor. The vortex shaped field is self stabilized and requires no longitudinal bias layers, yet responds effectively to external magnetic field variations by a shift of its center. Among its advantages, the sensor so formed permits the formation of a more effective shield configuration that reduces unwanted side reading.

SUMMARY OF THE INVENTION

The first object of this invention is to provide a CPP (current perpendicular to plane) magnetic tunneling junction (MTJ) read sensor which requires no external stabilization of the free layer magnetic moment.

A second object of this invention is to provide such a sensor in which the magnetic moment of the pinned layer is directionally stable.

The third object of this invention is to provide such a read sensor in which the sensor shields can be more closely formed about the sensor, thereby eliminating side-reading and providing generally more effective shielding of the element.

The fourth object of this invention is to provide a sensor with a thinner stack and less space between upper and lower shields, to improve the reading of high density media.

A fifth object of the present invention is to provide a sensor in which free layer stability is improved as the sensor becomes smaller in dimension and there is no loss in sensor sensitivity.

A sixth object of this invention is to provide a method of making this sensor.

These objects will be achieved by magnetizing the free layer of a CPP MTJ or GMR sensor in a circumferential pattern (vortex-shaped). The difference between such sensors is that the MTJ sensor comprises a free and pinned layer separated by a thin insulative tunneling barrier layer, whereas the GMR sensor comprises a free and pinned layer separated by a conducting, but non-magnetic, spacer layer. In either case, a vortex shaped magnetization pattern has no uncompensated edge poles and the magnetization pattern is therefore stable against thermal agitation or external excitation. In addition, the vortex pattern of the free layer allows the magnetization of the pinned layer to be set parallel to the air bearing surface (ABS) plane of the sensor, which is a more directionally-stable configuration. The conventional magnetization direction of the pinned layer is perpendicular to the ABS, leading to relatively unstable uncompensated poles at that surface. Further, the fact that an external stabilization scheme, such as laterally disposed longitudinal biasing layers, is not necessary, allows the sensor shields to be configured closely around the sensor edges, thus reducing unwanted side reading. In the same manner, the elimination of in-stack stabilization schemes allows a thinner sensor stack to be formed, which is advantageous for reading high density recorded media, and permits a pedestal shield formation, which further improves shielding.

The production of such a circumferential magnetic field within the free layer requires a strong external magnetizing field of approximately 1 Tesla to be applied perpendicular to the film plane during sensor formation and after the sensor dimensions have been established. This field produces a vertically directed magnetic field within the free layer. While the magnetization of the free layer is so directed, a perpendicular read current is sent through the sensor, also in a direction perpendicular to the film planes. This current establishes the required circumferentially directed magnetization. Then the strong external magnetizing field is removed and a vortex state will have been formed. Once this vortex state is formed, the current-produced field is removed and the vortex state remains. For a sensor of dimension: 0.1 micron×0.1 micron, and a read current of I=5 mA, the strength of the magnetic field, $I/2\pi r$, at the sensor edge is approximately 14 Oe.

Attention is drawn to FIG. 3 which shows the results of four experiments carried out using the vortex configuration of the present invention. The vertical axis represents the current produced by the sensor and the horizontal axis represents field strengths used to produce the sensor responses. The overlap of the results and the linearity of the response curve is a good indication of the excellent performance characteristics of the sensor.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying figures, wherein.

DESCRIPTION OF THE PREFERRED EMBODIMENTS

The present invention provides a CPP magnetic tunneling junction (MTJ) or giant magnetoresistive (GMR) read sensor whose free layer is magnetized in a (circumferential) vortex configuration, thereby eliminating uncompensated edge poles and providing self-stabilization. In addition, the pinned layer is magnetized parallel to the ABS plane of the sensor for more stable operation and, in two embodiments, the sensor is shielded by a closely configured shield and by a shield that includes a pedestal.

Figure 1:
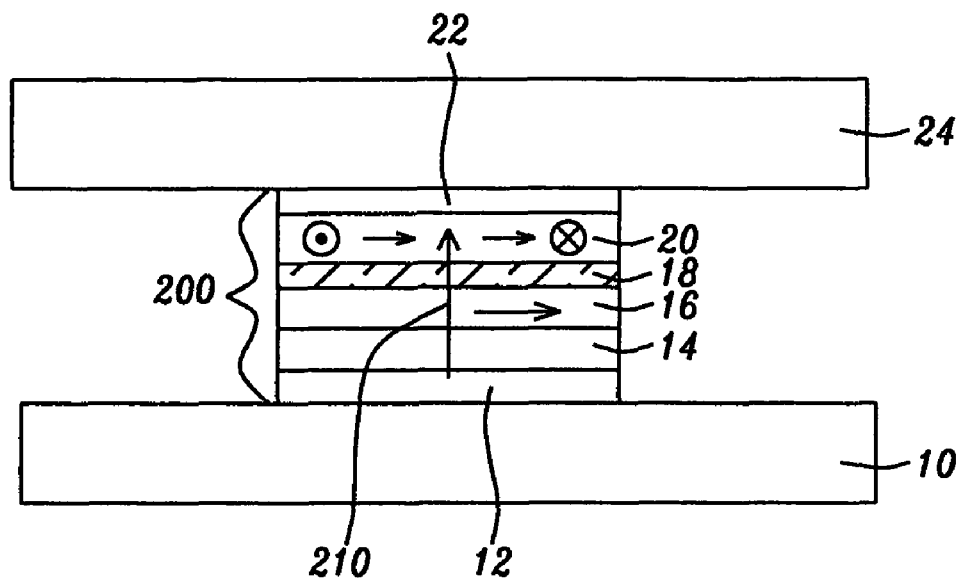
FIG. 1 is a schematic ABS view of a shielded MTJ (or GMR) CPP sensor of the type that incorporates the vortex magnetization of the present invention.

Referring first to FIG. 1, there is seen a schematic drawing of an ABS cross-section of the sensor of the present claimed invention in a first MTJ embodiment in which the upper (24) and lower (10) shields are horizontal layers of magnetically permeable material such as Co, Ni, Fe, NiFe, CoFe, CoNiFe, CoZrTa, CoZrHf or CoFeB and of a horizontal width between approximately 1 and 100 microns. The formation process begins with the formation of the lower shield. The layers of the cell element (200) are formed horizontally and are centrally and symmetrically disposed on the lower shield. The layers are formed in the following vertical order, from lower to upper shield. A bottom conducting lead layer (12) formed of electrically conducting material; an antiferromagnetic pinning layer (14) formed of antiferromagnetic material such as PtMn or IrMn, which are well known in the art; a ferromagnetic pinned layer (16), formed of ferromagnetic materials such as Co, Ni, Fe, NiFe, CoFe, CoNiFe, CoZrTa, CoZrHf or CoFeB; an insulating tunneling barrier layer (18) formed of oxides or nitrides of elements such as Al, Ta, Ti, V, Hf, Zr, Cr or Si; a ferromagnetic free layer (20) formed of the same materials as the ferromagnetic pinned layer; a top conducting lead layer (22) formed, as is the bottom lead layer, of a highly conducting material. The layered configuration is then patterned to desired horizontal dimensions and the upper shield is then formed on the upper conducting lead layer. Details of the patterning are not included, since the methods are well known in the art.

If the embodiment were to be a GMR sensor configuration, the tunneling barrier layer (18) would be replaced by a non-magnetic conductor layer, such as a layer of Cu. A central arrow (210) shows the direction of the sense current perpendicular to the cell planes and smaller arrows in the free layer (20) show the circumferential direction of the vortex magnetization. It is to be noted that the magnetization of the pinned layer occurs advantageously subsequent to layer formations but prior to the dimensional patterning of the sensor to create the desired horizontal dimensions of the sensor. The vortex magnetization of the free layer occurs subsequent to the horizontal sensor patterning.

Figure 2:
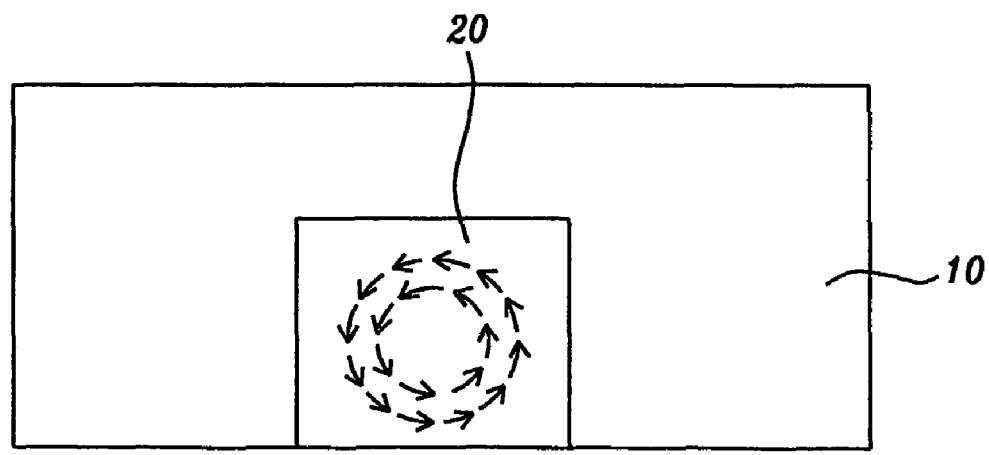
FIG. 2 is a schematic overhead view of the sensor of FIG. 1, showing the free layer with circumferential magnetic field lines of the vortex magnetization and the bottom shield below the free layer.
Figure 3:
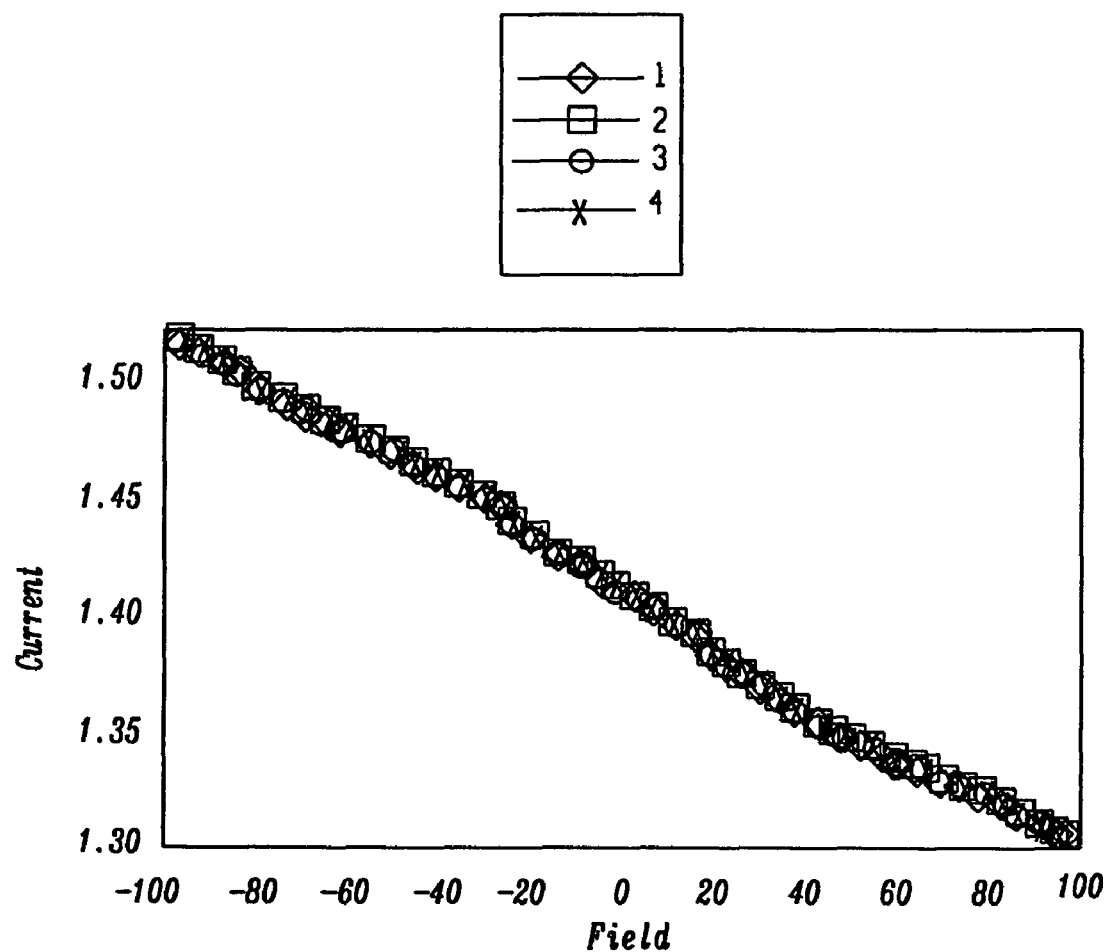
FIG. 3 is a graphical compilation of 4 experiments carried out on an unshielded sensor of the present invention. The linear response is over a wide range of external field transitions.

The now patterned free layer (20), in the patterned sensor formation, is magnetized circumferentially as is more clearly shown in the overhead view in FIG. 2, which shows the free layer (20) positioned over the lower shield (10). The magnetization of the free layer is accomplished most advantageously by a process in which a strong external vertical magnetic field of approximately 1 Tesla is first applied to the system to set the magnetization within the free layer as a uniform field in a vertical direction. While this field is maintained, a vertically directed current of magnitude approximately 5 mA (milliamperes) is directed from the bottom lead towards the upper lead, setting the vertical field into a circumferential vortex shaped field such as that shown in FIG. 2.

Once the vortex magnetization is formed, the uniform perpendicular field is removed. Then the current-induced field is removed, and the vortex magnetization remains. The strength of the circumferential field at the edge of the free layer is approximately 14 Oe, for a sensor in which the free layer (as well as the other layers) is of horizontal dimension (width and depth) less than 0.1×0.1 microns. In the ABS plane of the present figure, the vortex shape of the free layer magnetization is indicated schematically by vectors emerging from the figure plane (dotted circles), parallel to the figure plane (arrows) and entering the figure plane (crossed circles). The magnetization of the pinned layer (16) can be set (arrow) in a direction parallel to the figure plane and is pinned unidirectionally by the antiferromagnetic pinning layer (14). As has been noted, this direction of pinned layer magnetization enhances the stability of the sensor. A large arrow in the layer configuration (210) indicates the direction of the sense current during sensor operation. The total thickness of the cell, which is the space between the upper and lower shields, is between approximately 100 and 1000 angstroms and is significantly reduced because in-stack biasing layers are not required.

Figure 4:
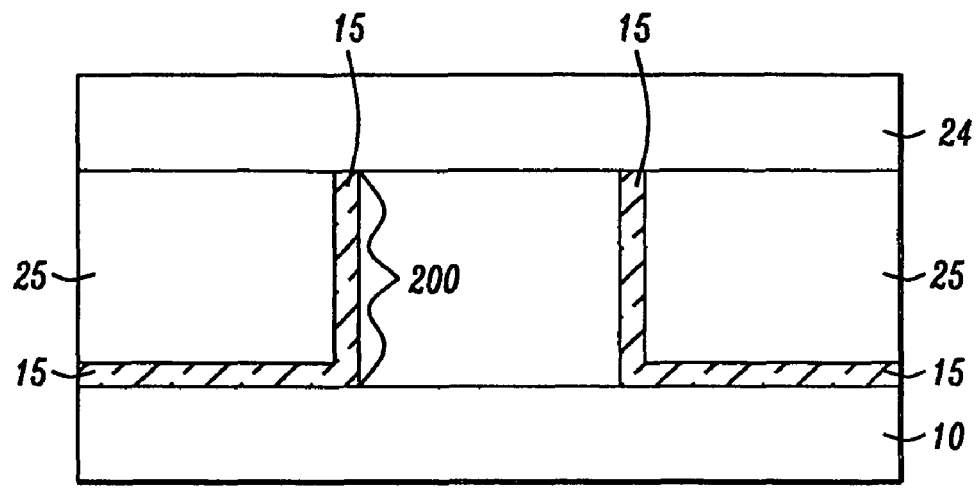
FIG. 4 is a schematic diagram in the ABS plane of a closely configured shielded sensor utilizing the vortex field.

Referring next to FIG. 4, there is shown a second embodiment in which the layer configuration of the cell element (200) is formed as described in FIG. 1, but it is enclosed in a shield that closely surrounds the layers and protects them from extraneous fields and side-reading. The lower shield is formed first and is horizontally shaped as the lower shield in FIG. 1, but in forming the upper shield, two vertical layers (25) of magnetically permeable material, of width between approximately 5 and 500 angstroms, are formed projecting downward from a lower surface of a horizontal portion of the upper shield (24). The horizontal portion (24) is substantially of the same width and thickness as the lower shield (10), and are horizontally symmetrically disposed about the sides of the layer configuration but do not contact the sides. The spaces (15) between the upper and lower shields and the sides of the layer configuration are filled with an insulating material.

Figure 5:
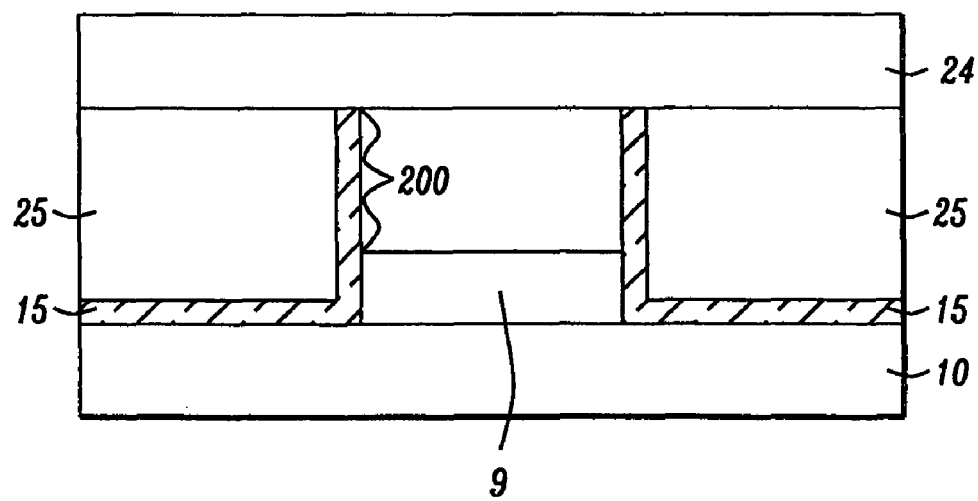
FIG. 5 is a schematic diagram in the ABS plane of a closely configured shielded sensor in which the bottom shield also includes a pedestal

Referring to FIG. 5, there is shown a third embodiment in which the upper shield remains as in FIG. 4, but the lower shield (10) is formed to include a centrally symmetric pedestal (9), having substantially the same width as the cell element (200), on which the configuration of element layers is formed. The upper shield must be correspondingly raised and its downward projecting portions (25) must be lengthened. The pedestal raises the element within the region between the upper and lower shields, providing even greater protection of the element from extraneous external fields and side-reading.

As is understood by a person skilled in the art, the preferred embodiments of the present invention are illustrative of the present invention rather than limiting of the present invention. Revisions and modifications may be made to methods, materials, structures and dimensions employed in fabricating a shielded CPP MTJ or GMR read sensor with self-stabilized free layer having vortex shaped magnetization, while still providing a method for fabricating a shielded CPP MTJ or GMR read sensor with self-stabilized free layer having vortex shaped magnetization in accord with the spirit and scope of the present invention as defined by the appended claims.

What is claimed is:

1. A CPP GMR or MTJ read sensor having a self-stabilized circumferentially magnetized free layer, comprising:
   upper and lower magnetic shields formed of highly permeable magnetic material;
   a horizontally layered and patterned CPP GMR or MTJ sensor element formed symmetrically between said shields, said element including a soft (low coercivity) magnetic free layer and a soft magnetic pinned layer; wherein,
   said free layer is magnetized circumferentially in a vortex configuration; and
   said pinned layer is magnetized unidirectionally within its layer plane and in a direction parallel to an air-bearing surface plane of the sensor and wherein no additional biasing layers provide stabilization to said free layer.

2. The read sensor of claim 1 wherein said sensor element is a MTJ element, comprising:
   a lower conducting lead layer formed on said lower magnetic shield layer;
   a pinning layer formed of antiferromagnetic material formed on said lower conducting lead layer and pinning said pinned layer with a unidirectional magnetization that is parallel to an ABS plane of the sensor;
   said pinned layer, formed on the pinning layer, magnetized unidirectionally and pinned by the pinning layer;
   a tunneling barrier layer formed, of insulating material, on the pinned layer;
   said ferromagnetic free layer formed on the tunneling barrier layer and magnetized in a self-stabilized vortex configuration having no additional biasing layers;
   an upper conducting lead layer formed on said free layer and contacting said upper magnetic shield layer.

3. The read sensor of claim 2 wherein the tunneling barrier layer is formed of oxides or nitrides of Al, Ta, Ti, V, Hf, Zr, Cr or Si and is formed to a thickness between approximately 2 and 20 angstroms.

4. The read sensor of claim 1 wherein said sensor element is a GMR element, comprising:
   a lower conducting lead layer formed on said lower magnetic shield;
   a pinning layer formed of antiferromagnetic material formed on said lower conducting lead layer and pinning said pinned layer with a unidirectional magnetization that is parallel to an ABS plane of the sensor;
   said pinned layer, formed on the pinning layer, magnetized unidirectionally and pinned by the pinning layer;
   a conducting, non-magnetic spacer layer formed on the pinned layer;
   said ferromagnetic free layer formed on the tunneling barrier layer and magnetized in a self-stabilized vortex configuration having no additional biasing layers;
   an upper conducting lead layer formed on said free layer and contacting said upper magnetic shield.

5. The read sensor of claim 4 wherein the spacer layer is formed of Cu to a thickness between approximately 5 and 50 angstroms.

6. The read sensor of claim 1 wherein said free and pinned layers are formed, to a thickness between approximately 10 and 100 angstroms of Co, Ni, Fe, NiFe, CoFe, CoNiFe, CoZrTa, CoZrHf, or CoFeB.

7. The read sensor of claim 1 wherein said free layer has horizontal dimensions width and depth) that are less than 0.1 micron×0.1 micron.

8. The read sensor of claim 1 wherein said upper and lower shields are horizontal layers formed to a thickness between approximately 0.1 and 5 microns and of an equal horizontal width between approximately 1 and 100 microns, but which is greater than the horizontal width of said sensor element and wherein a lower surface of said upper shield contacts an upper surface of said element and an upper surface of said lower shield contacts a lower surface of said element.

9. The read sensor of claim 8 wherein said upper shield includes two downward projecting portions, of equal height and width, symmetrically disposed to either side of the cell element but neither contacting said cell element nor said lower shield and insulated therefrom, forming, thereby, a downward facing concave cavity substantially enclosing said cell element.

10. The read sensor of claim 9 wherein said lower shield includes a centrally located pedestal formed beneath a lower surface of said cell element, said pedestal thereby vertically elevating the cell element and wherein the upper shield is raised relative to the lower shield and the downward projecting portions of the upper shield are correspondingly lengthened to form a downward facing cavity of increased height.

* * * * *